United States Patent [19]

Gailus

[11] Patent Number: 5,134,718
[45] Date of Patent: Jul. 28, 1992

[54] FAST PHASE SHIFT ADJUSTING METHOD AND DEVICE FOR LINEAR TRANSMITTER

[75] Inventor: Paul H. Gailus, Prospect Heights, Ill.

[73] Assignee: Motorola, Inc., Schaumburg, Ill.

[21] Appl. No.: 607,423

[22] Filed: Oct. 31, 1990

[51] Int. Cl.$^5$ .............................................. H04B 1/02
[52] U.S. Cl. ..................................... 455/102; 455/103
[58] Field of Search ............... 455/103, 115, 126, 102; 375/67, 109, 111, 118

[56] References Cited

U.S. PATENT DOCUMENTS

| | | | |
|---|---|---|---|
| 4,610,030 | 9/1986 | Dominguez et al. | 455/126 |
| 4,696,017 | 9/1987 | Masheff et al. | 375/60 |
| 4,993,986 | 6/1990 | Leitch | 455/119 |
| 5,066,922 | 11/1991 | Leitch | 455/126 |

Primary Examiner—Curtis Kuntz
Attorney, Agent, or Firm—Darleen J. Stockley

[57] ABSTRACT

A method and device are set forth for, where a linear transmitter has inphase and quadrature modulation paths for an input signal and at least one open feedback signal path is provided, substantially correcting an initial phase relationship between an input signal having an input signal vector with a phase and a magnitude, and an input feedback signal having an input feedback signal vector with a phase and a magnitude. The present invention provides a more time-efficient phase correction to at least one feedback signal path.

29 Claims, 5 Drawing Sheets

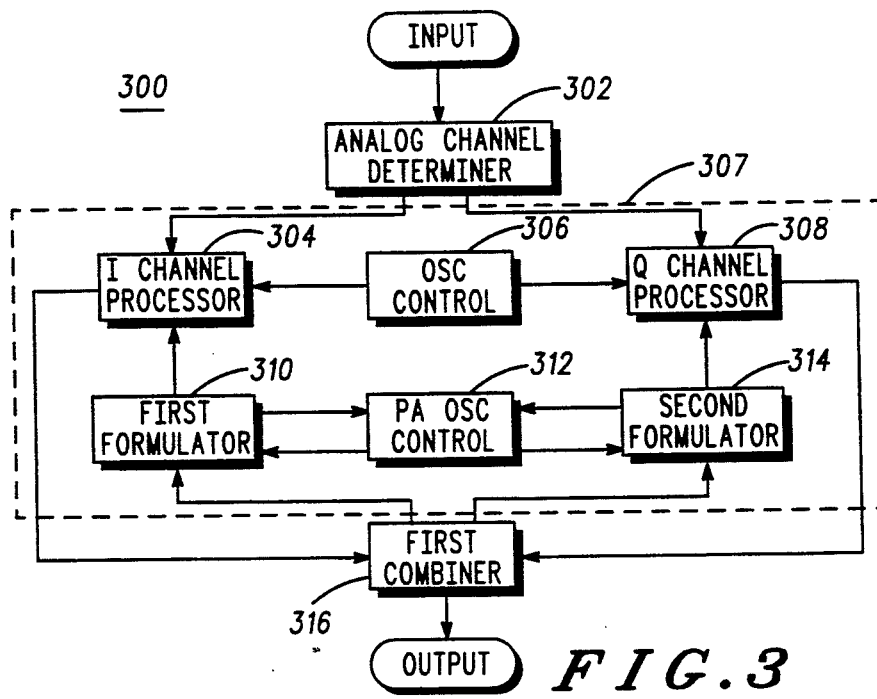
FIG.3
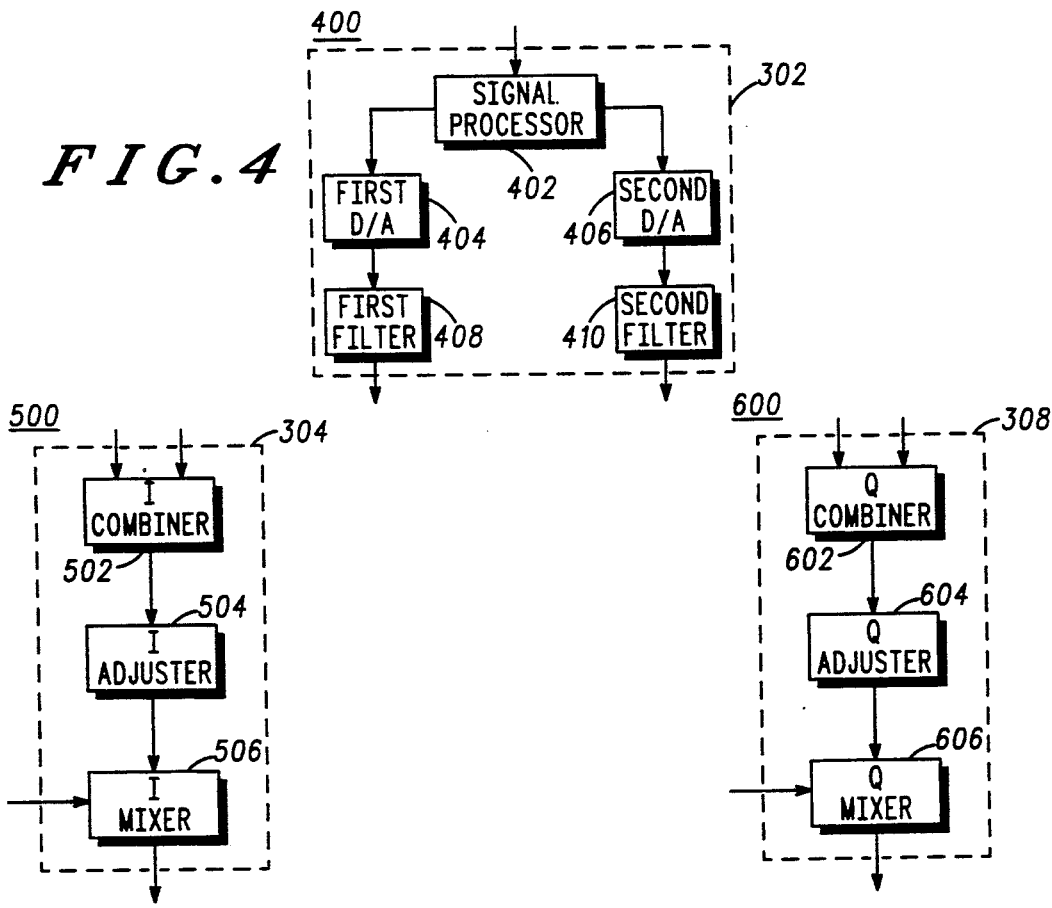
FIG.4
FIG.5
FIG.6

FAST PHASE SHIFT ADJUSTING METHOD AND DEVICE FOR LINEAR TRANSMITTER

FIELD OF THE INVENTION

This invention relates in general to linear transmitters, and more particularly, to phase shift adjustment of linear transmitters utilizing negative feedback.

BACKGROUND OF THE INVENTION

Transmitters typically implement a linear power amplifier to amplify modulated signals that have a time-varying amplitude (magnitude) for transmission. It is desirable for the linear power amplifier to provide good linearity and efficient power conversion. Class B or AB power amplifiers are typically the most suitable amplifiers for obtaining a best efficiency relative to distortion. However, many communications applications require a further reduction in amplifier distortion, which may be obtained by negative feedback. A cartesian loop is a known method for implementing negative feedback around a linear power amplifier. A net phase shift around the cartesian loop must be maintained near 180 degrees at a desired channel frequency in order to insure stable operation. Component variability, time delay in the loop, and other factors can cause the loop phase shift to vary considerably. Therefore, in order to keep the cartesian loop stable in the presence of phase shift variation, methods for measuring and adjusting the loop phase shift have been proposed. However, these earlier methods have required low frequency sine waves as input signals, resulting in somewhat complex phase adjustment computation.

Phase shift compensation in cartesian-loop transmitters has been utilized, but has required at least 40 milliseconds. There is a need for a faster phase shift compensation method for a linear transmitter using negative feedback to allow more time for productive use of a transmitted signal.

SUMMARY OF THE INVENTION

In a linear transmitter having inphase and quadrature modulation paths for at least a first input signal, a device for and method of correcting an initial phase relationship between the at least first input signal having an input signal vector with an input phase and an input magnitude and at least a first input feedback signal having a first input feedback signal vector with a first input feedback phase and a first input feedback magnitude, wherein at least one open loop signal path is set forth, the device and method utilizing at least the steps of:

providing, on the at least one open loop signal path, at least a first test signal having at least a first test signal vector with known inphase and quadrature components to the modulation paths to obtain at least a first feedback signal vector and at least a first carrier feedback vector and obtaining a first vector sum of the at least first feedback signal vector and the at least first carrier feedback vector, the first vector sum being at least a first resultant feedback signal vector;

obtaining at least a first comparison of each resultant feedback signal vector obtained with the test signal components utilized to obtain that resultant feedback signal vector; and adjusting the initial phase relationship between the at least first input signal and the at least first input feedback signal in response to the at least first comparison, such that the time required for implementing the correction is less than 40 milliseconds.

BRIEF DESCRIPTION OF THE DRAWINGS

FIG. 3 is a block diagram of one hardware implementation of the present invention.

FIG. 4 illustrates one hardware implementation of an analog channel determiner utilized in the present invention.

FIG. 5 illustrates one hardware implementation of an I channel processor utilized in the present invention.

FIG. 6 illustrates one hardware implementation of a Q channel processor utilized in the present invention.

DETAILED DESCRIPTION OF A PREFERRED EMBODIMENT

Figure 1:
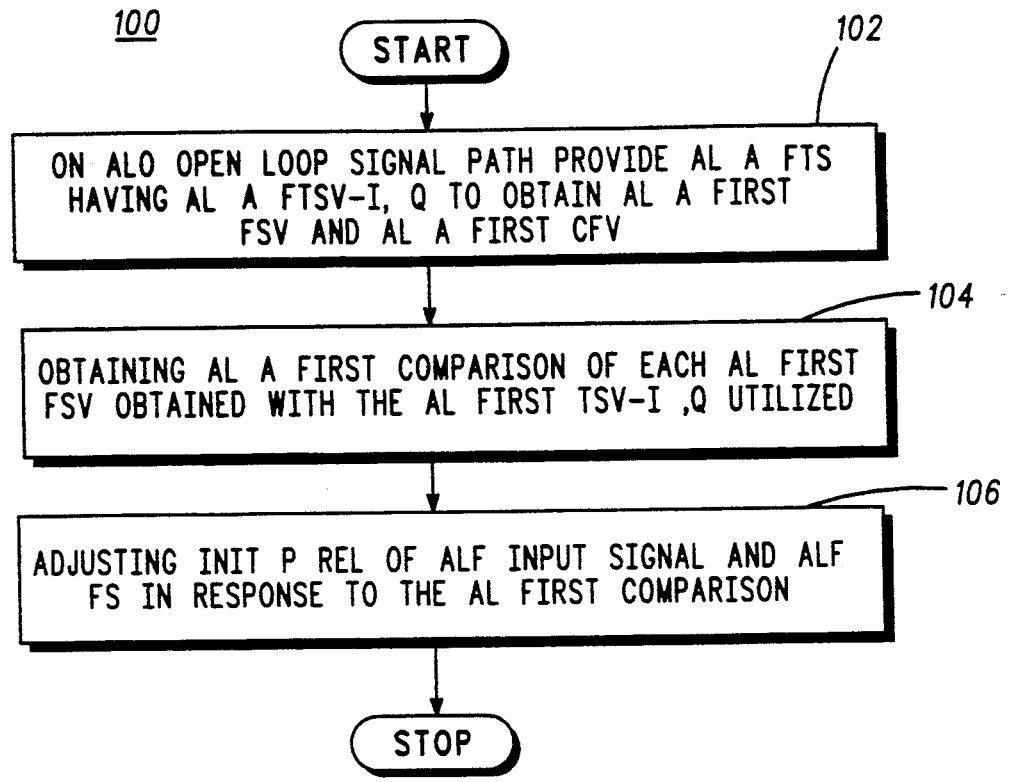
FIG. 1 is a flow chart illustrating one embodiment of the method of the present invention.

FIG. 1, numeral 100, is a flow chart illustrating one embodiment of the method of the present invention for correcting an initial phase relationship between at least a first input signal having a first input signal vector with an input phase and an input magnitude and at least a first input feedback signal having a first input feedback signal vector with a first input feedback signal phase and a first input feedback signal magnitude, in a linear transmitter having inphase and quadrature modulation paths for the at least first input signal, wherein at least one open feedback signal path is provided, such that an implementation time of less than 40 milliseconds is utilized.

It can be shown that:

$$(V_{iq} * V_{fi}) - (V_{ii} * V_{fq}) = |V_i| * |V_f| * \sin \beta \quad (1)$$

where $\beta$ is a phase shift between an input signal vector $V_i$ that has an inphase component $V_{ii}$ and a quadrature component $V_{iq}$, and a resultant feedback signal vector $V_f$ that has an inphase component $V_{fi}$ and a quadrature component $V_{fq}$. At least a first test signal (FTS), typically being at least a first test signal pulse (FTSP) is provided on at least one open loop signal path, each at least first test signal pulse having at least a first test signal vector with known inphase and quadrature components (AL FIRST TSV-I,Q) applied to the modulation paths, such that at least one carrier feedback vector (AL A FIRST CFV) and at least a first feedback signal having at least a first feedback signal vector having inphase and quadrature components (AL A FIRST FSV-I,Q) are obtained (102). The at least one carrier feedback vector is typically not desired, but is present in practical circuit implementations.

Each AL A FSV-I,Q is compared to the AL FIRST TSV-I,Q utilized (104), each at least first comparison being used to provide for adjusting the initial phase relationship (INIT P REL) of the at least first (ALF) input signal and the at least first feedback signal (ALF FS) in accordance with equation (1) of the preceding paragraph.

As is set forth more particularly below, a procedure of application of the at least one test signal pulse to only one of: the inphase modulation path and the quadrature modulation path, allows simplification of phase shift correction determination. Thus, for an input of a test signal pulse into only the inphase modulation path, phase shift correction determination would simplify to:

$$V_{fq} = -\text{sgn}(V_{ii})^* |V_{fi}| * \sin \beta.$$

Figure 2B:
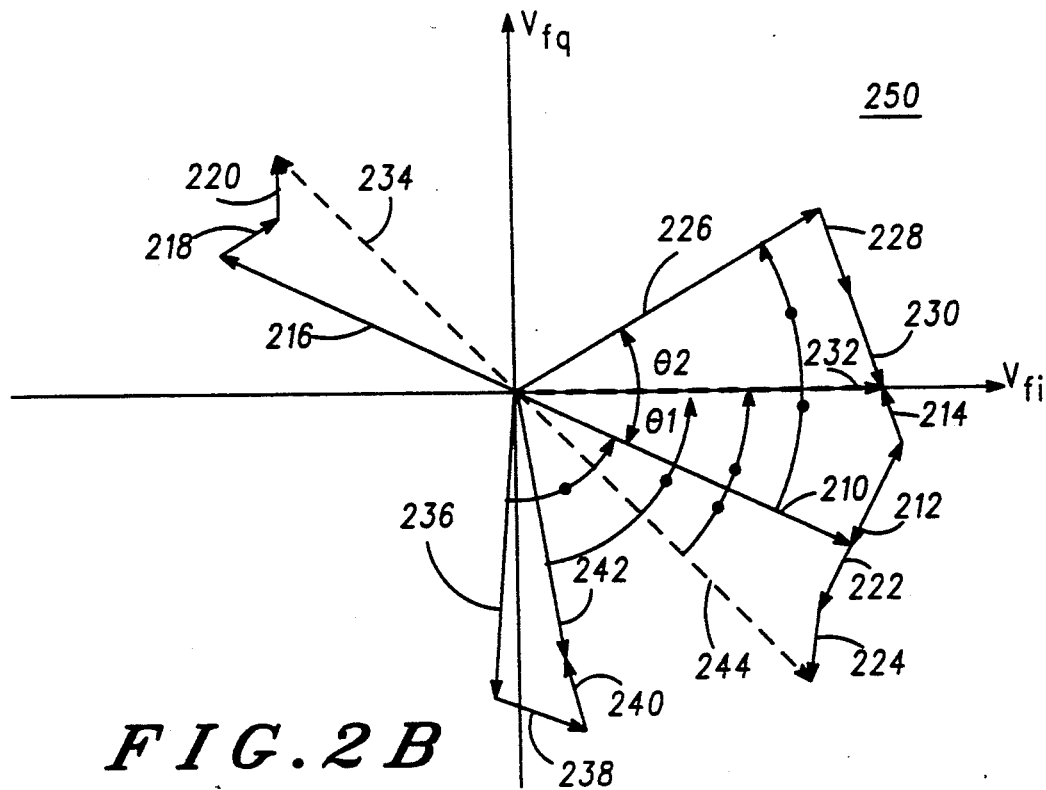
FIG. 2B is a graphic representation of vectors implemented in one of the embodiments of the method of the present invention set forth in FIG. 2A.
Figure 2A:
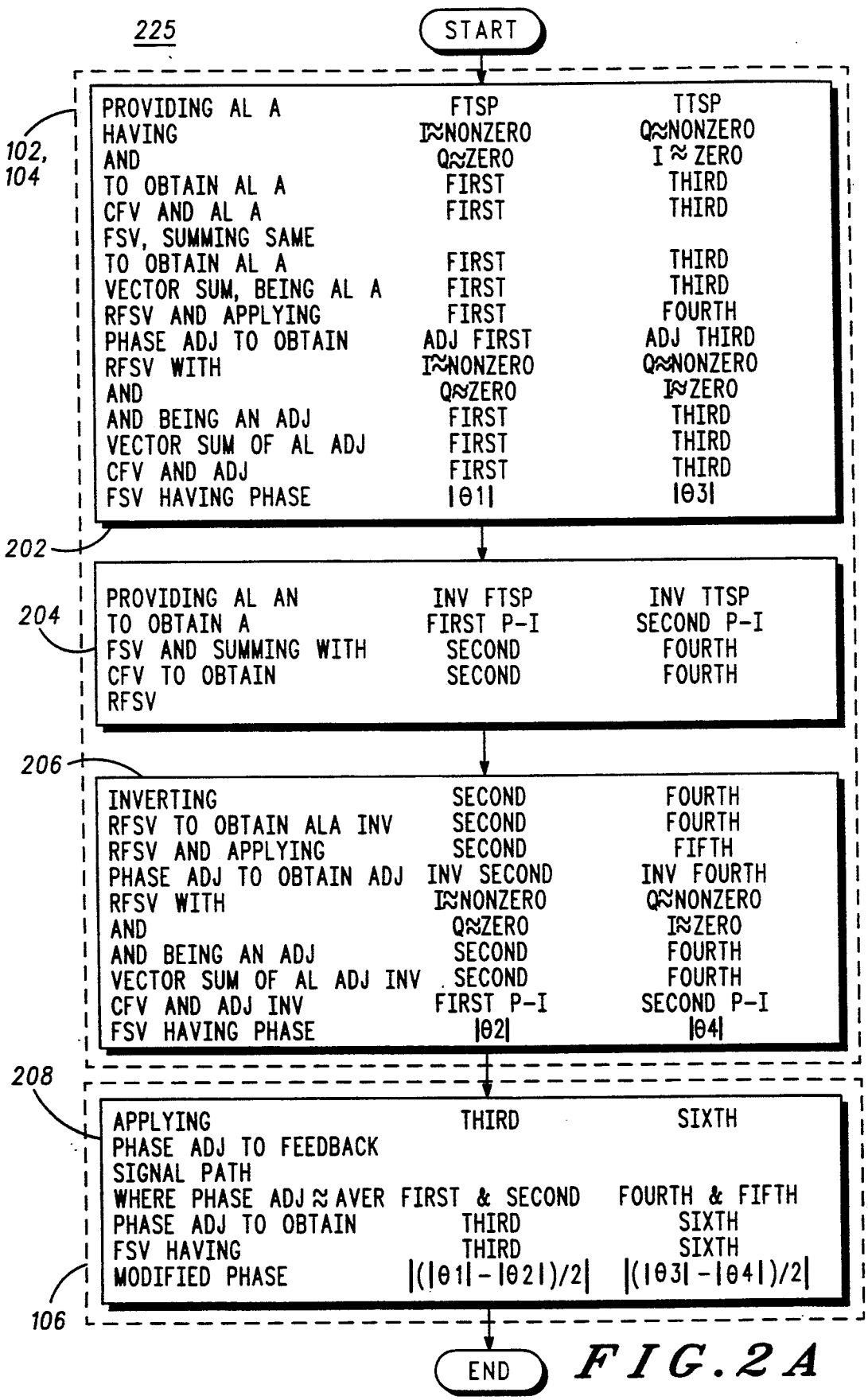
FIG. 2A illustrates more specifically one embodiment of the method of the present invention.

FIG. 2A, numeral 225, illustrates more specifically one embodiment of the method of the present invention utilizing applying the at least at least first test signal pulse (AL A FTSP) only to a nonzero inphase modulation path ($I \approx$ NONZERO: center column designations), and alternately, only to a nonzero quadrature modulation path ($Q \approx$ NONZERO: right column designations). Below, the alternate embodiments are separated by commas, the nonzero inphase modulation path input being before the comma, and the nonzero quadrature modulation path input being after the comma. Inphase and quadrature components of a vector are designated I and Q, respectively.

Specifically, in one embodiment of the method of the present invention illustrated in FIG. 2A, in a linear cartesian-loop feedback transmitter having inphase and quadrature modulation paths for at least a first input signal, a method of the present invention is set forth for correcting an initial phase relationship between the at least first input signal having a first input signal vector with a first input magnitude and a first input phase and at least a first input feedback signal having a first input feedback signal vector with a first input feedback magnitude and a first input feedback phase, wherein at least one open loop feedback signal path is provided, comprising at least the steps of:

providing at least a first test signal, being at least a FTSP, third test signal pulse (TTSP) input having a Q,I component substantially being ZERO, and with an I,Q component substantially being NONZERO, to obtain at least (AL) a FIRST, THIRD carrier feedback vector (CFV) and AL A FIRST,THIRD feedback signal vector (FSV) (202) having a feedback signal path;

summing the AL FIRST,THIRD CFV and AL FIRST,THIRD FSV to obtain at least (AL) a FIRST,THIRD VECTOR SUM, that vector sum being AL a FIRST,THIRD resultant feedback signal vector (RFSV) (202);

applying a FIRST,FOURTH phase adjustment (PHASE ADJ) to obtain an adjusted (ADJ) FIRST,THIRD RFSV with substantially a nonzero inphase component, nonzero quadrature component ($I \approx$ NONZERO,$Q \approx$ NONZERO) and substantially a zero quadrature,zero inphase component ($Q \approx$ ZERO,$I \approx$ ZERO) and the RFSV being an adjusted (ADJ) FIRST,THIRD VECTOR SUM of at least (AL) an adjusted (ADJ) FIRST,-THIRD CFV and an adjusted (ADJ) FIRST,-THIRD FSV having PHASE $|\theta_1 I|$, $|\theta_3 I|$ relative to the ADJ FIRST,THIRD RFSV (202) where $|\theta_1 I|$, $|\theta_3 I|$ is a phase error magnitude of the FIRST,FOURTH phase adjustment and is typically due to the presence of the ADJ FIRST,THIRD CFV;

providing at least (AL) an inverted (INV) FTSP,TTSP to obtain a FIRST,SECOND pulse-invert (P-I) FSV (204);

summing the FIRST,SECOND P-I FSV with a SECOND,FOURTH CFV to obtain a SECOND,-FOURTH RFSV (204);

inverting the SECOND,FOURTH RFSV to obtain an inverted (INV) SECOND,FOURTH RFSV and applying a SECOND,FIFTH phase adjustment (PHASE ADJ) to obtain an adjusted (ADJ) inverted (INV) SECOND,FOURTH RFSV with a $I \approx$ NONZERO,$Q \approx$ NONZERO and $Q \approx$ ZERO,$I \approx$ ZERO, and the ADJ INV SECOND,FOURTH RSFV being an adjusted (ADJ) SECOND,FOURTH VECTOR SUM of the at least adjusted inverted (AL ADJ INV) SECOND,-FOURTH CFV and an adjusted inverted (ADJ INV) FIRST,SECOND P-I FSV, the ADJ INV FIRST,SECOND P-I FSV having a PHASE $|\theta_2 I|$, $|\theta_4 I|$ relative to the ADJ INV SECOND, FOURTH RFSV (206) where $|\theta_2 I|$, $|\theta_4 I|$ is a phase error magnitude of the SECOND,FIFTH phase adjustment and is typically due to a presence of the AL ADJ INV SECOND,FOURTH CFV; and applying a THIRD,SIXTH PHASE adjustment (ADJ) to the feedback signal path where the phase adjustment is substantially equal to the algebraic average of the FIRST,FOURTH and SECOND,-FIFTH phase adjustments (208), thereby obtaining a THIRD,SIXTH feedback signal vector having a THIRD,SIXTH modified phase magnitude of substantially $$\left| \frac{|\theta_1| - |\theta_2|}{2} \right|, \left| \frac{|\theta_3| - |\theta_4|}{2} \right|,$$

thereby adjusting the initial relationship between the at least first (ALF) input signal and the at least first input feedback signal (AL A FIRST FS). The THIRD-,SIXTH modified phase magnitude is a phase error magnitude remaining at an end of the phase adjustments set forth above, and is typically less than a magnitude of either of the phase error magnitudes $|\theta_1 I|$, $|\theta_3 I|$ or $|\theta_2 I|$, $|\theta_4 I|$.

FIG. 2B is a graphic representation of vectors implemented in one of the embodiments of the method of the present invention set forth in FIG. 2A, the center column. Each carrier feedback vector is characterized by at least a pair of associated vectors, a first vector of that pair representing a carrier feedthrough term influenced by each phase adjustment, and a second vector of that pair representing a carrier feedthrough term not influenced by each phase adjustment. Thus, each carrier feedback vector (CFV) is a CFV vector sum of its at least pair of associated vectors.

Upon AL A FTS being provided on an at least one open loop signal path, the AL FTS having at least a first test signal vector (FTSV) and the AL FTS being input with a nonzero I component and a zero Q component (202, center column), an at least FIRST CFV (238, 240) characterized by at least a first pair of associated vectors (238, 240) and a FIRST FSV (236) are obtained. The FIRST FSV (236) and FIRST CFV (238, 240) are summed to obtain a FIRST RFSV (242). A first phase adjustment is applied to the FIRST RFSV (242) to obtain an ADJ FIRST RFSV (232) with a substantially nonzero inphase component ($V_{fi}$) and a substantially zero quadrature component ($V_{fq}$) and being an adjusted first vector sum of at least an ADJ FIRST CFV (212, 214) and an ADJ FIRST FSV (210) having a phase Θ1 relative to the ADJ FIRST RFSV (232). FIG. 2B sets forth the first phase adjustment by means of two dashed arrows, with a single dot thereon, that illustrate rotation of the FIRST FSV (236) to a position of the ADJ FSV (210), and the rotation of the FIRST RFSV (242) to a position of the ADJ FIRST RFSV (232).

At least an INV FTSP is provided on the at least one open loop signal path to obtain a FIRST P-I FSV (216) at an angle of (180 minus Θ1) and at least (AL) a SECOND CFV (218, 220) characterized by at least a second pair of associated vectors (218, 220). The FIRST P-I FSV (216) is summed with the AL SECOND CFV (218, 220) to obtain a SECOND RFSV (234). The SECOND RFSV (234) is inverted to obtain an inverted (INV) second RFSV (244), and a second phase adjustment is applied to the INV SECOND RFSV (244) to obtain an ADJ INV SECOND RFSV (232) with a substantially nonzero inphase component ($V_{fi}$) and a substantially zero quadrature component ($V_{fq}$) and being an adjusted second vector sum of at least an ADJ INV SECOND CFV (228, 230) and an ADJ INV FIRST P-I FSV (226) having a phase θ2 relative to the ADJ INV SECOND RFSV (position substantially also that of 232). After the second phase adjustment, a magnitude of quadrature components of the vectors combined is substantially zero.

A THIRD, SIXTH phase adjustment is applied to an initial phase relationship of an at least first input signal and at least a first input feedback signal, where the THIRD, SIXTH phase adjustment is substantially equal to an algebraic average of the FIRST, FOURTH and SECOND, FIFTH phase adjustments, thereby obtaining a THIRD, SIXTH feedback signal vector having a THIRD, SIXTH modified phase magnitude substantially equivalent to $$\left| \frac{|\theta_1| - |\theta_2|}{2} \right|, \left| \frac{|\theta_3| - |\theta_4|}{2} \right|$$

(208). Thus, typically the at least one open loop signal path is closed subsequent to adjusting the initial phase relationship stated above, and the magnitude of the at least first test signal vector is at this time reduced, allowing closure of the at least one open cartesian feedback loop with minimal splatter or off channel energy, and providing a time-efficient phase correction.

FIG. 3, numeral 300, is a block diagram of one hardware implementation of the present invention setting forth, in a linear transmitter having inphase and quadrature modulation paths for an input signal, a device for correcting an initial phase relationship between at least a first input signal having at least a first input signal vector with an input phase and an input magnitude and at least a first input feedback signal having a first input feedback signal vector with an input feedback phase and an input feedback magnitude, wherein at least one open feedback signal path is provided. The device utilizes an analog channel determiner (302) connected to an input to process at least a first test signal having at least a first test signal vector with known inphase and quadrature components in the modulation paths. An adjuster (307) is operably connected to the analog channel determiner (302) and to a first combiner (316) such that the inphase and the quadrature components of the at least one test signal vector provide at least a first feedback signal vector (FIRST FSV). The at least FIRST FSV is compared with the at least first test signal vector and is modified by the adjuster (307) in relation thereto. A typical adjustment is modifying one of the inphase and quadrature components of the at least one FSV to zero, thereby obtaining an FSV with substantially only one inphase, quadrature (inphase/quadrature) component and a first phase error.

Figure 9:
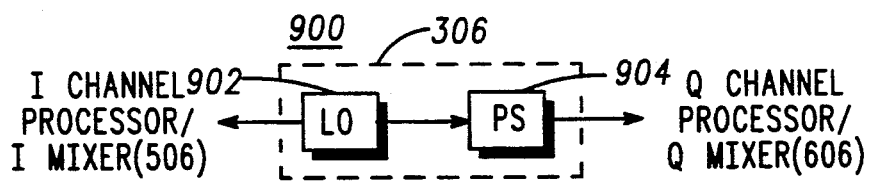
FIG. 9 illustrates one hardware implementation of an oscillator control utilized in the present invention.

FIG. 3 further sets forth a hardware implementation of the present invention with the analog channel determiner (302) providing an inphase component of the at least first test signal to an inphase (I) channel processor (304) and a quadrature component of the at least first test signal to a quadrature (Q) channel processor (308). The I channel processor (304) and the Q channel processor (308) are connected to an oscillator (OSC) control (306). FIG. 9, numeral 900, sets forth one hardware implementation of an oscillator control (306), such that a local oscillator (902), as is known in the art, is connected to an inphase (I) mixer (506, FIG. 5) of the I channel processor (304) and is connected by means of a phase shifter (PS) (904) to a quadrature (Q) mixer (606, FIG. 6) of the Q channel processor (308). The PS (904) typically shifts a signal ninety degrees.

FIG. 4, numeral 400, illustrates one hardware implementation of an analog channel determiner utilized in the present invention, being a signal processor (402) utilized to provide at least two digital signal paths to at least a first (404) and a second (406) digital to analog converter, the at least first and second digital to analog converters being further connected to at least a first (408) and a second (410) filter. The at least first (408) and second (410) filters are typically lowpass, providing inphase (408) and quadrature (410) input modulation paths.

FIG. 5, numeral 500, illustrates one hardware implementation of an inphase (I) channel processor (304) utilized in the present invention, that processor having an inphase (I) combiner (502) connected to an inphase (I) adjuster (504), and the inphase (I) adjuster (504) connected to an inphase (I) mixer (506). Typically, the inphase (I) combiner (502) is a first summer that sums the inphase component of the at least first input test signal, when desired, with an inphase feedback signal vector. The inphase (I) adjuster (504) typically comprises at least a second summer for addition of at least one input signal path carrier feedthrough vector, an amplifier for amplification, if desired, and a lowpass loop filter. The inphase (I) mixer (506) typically mixes an adjusted signal from the inphase (I) adjuster (504) with an oscillator control signal from the oscillator control local oscillator (902). Further the inphase (I) mixer (506) of the inphase (I) channel processor (304) is connected to the first combiner (316) to provide an adjusted inphase input.

FIG. 6, numeral 600, illustrates one hardware implementation of a quadrature (Q) channel processor (308) utilized in the present invention, that processor having a quadrature (Q) combiner (602) connected to a quadrature (Q) adjuster (604), and the quadrature (Q) adjuster (604) connected to a quadrature (Q) mixer (606). Typically, the quadrature (Q) combiner (602) is a third summer for summing the quadrature component of the at least one input test signal, when desired, with a quadrature feedback signal vector. The quadrature (Q) adjuster (604) typically comprises at least a fourth summer for addition of at least one upper path carrier feedback vector, an amplifier for amplification, if desired, and a lowpass loop filter. The quadrature (Q) mixer (606) typically provides for mixing of an adjusted signal from the quadrature (Q) adjuster (604) with an oscillator control signal from the oscillator control local oscillator (902). Further the quadrature (Q) mixer (606) of the quadrature (Q) channel processor (308) is connected to the first combiner (316) to provide an adjusted quadrature input.

The first combiner (316) typically includes a power amplifier, the linearity of which is improved by negative feedback when all feedback signal paths are closed subsequent to the phase adjustments of the present invention.

Figure 7:
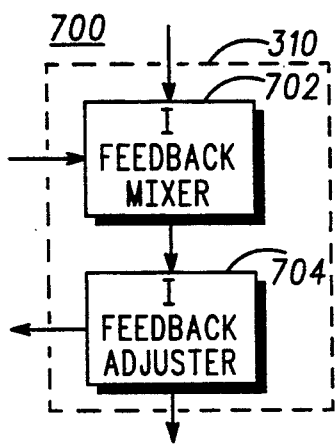
FIG. 7 illustrates one hardware implementation of a first formulator utilized in the present invention.

A first formulator (310) is connected to the first combiner (316) and is operably controlled by connections with a phase adjust oscillator control (PA OSC CONTROL) (312). The first formulator, as illustrated in one implementation further set forth in FIG. 7, numeral 700, typically comprises an inphase (I) feedback mixer (702) for mixing an inphase feedback signal with a phase adjusted oscillator control signal and an inphase (I) feedback adjuster (704). The inphase (I) feedback adjuster (704) typically comprises at least a fifth summer for addition of at least an inphase carrier feedback vector and an adjustment for, when desired, allowing the inphase feedback loop to be open.

Figure 8:
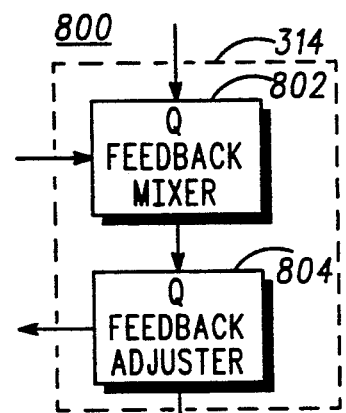
FIG. 8 illustrates one hardware implementation of a second formulator utilized in the present invention.

A second formulator (314) is connected to the first combiner (316) and is operably controlled by connections with a phase shifter (904) that is attached to a phase adjust oscillator control (PA OSC CONTROL) (312). The second formulator, as illustrated in one implementation further set forth in FIG. 8, numeral 800, typically comprises a quadrature (Q) feedback mixer (802) for mixing a quadrature (Q) feedback signal with a phase adjusted oscillator control signal and a quadrature (Q) feedback adjuster (804). The quadrature feedback adjuster (804) typically comprises at least a sixth summer for addition of at least one quadrature carrier feedback vector and an adjustment for, when desired, allowing the quadrature feedback loop to be open.

Figure 10:
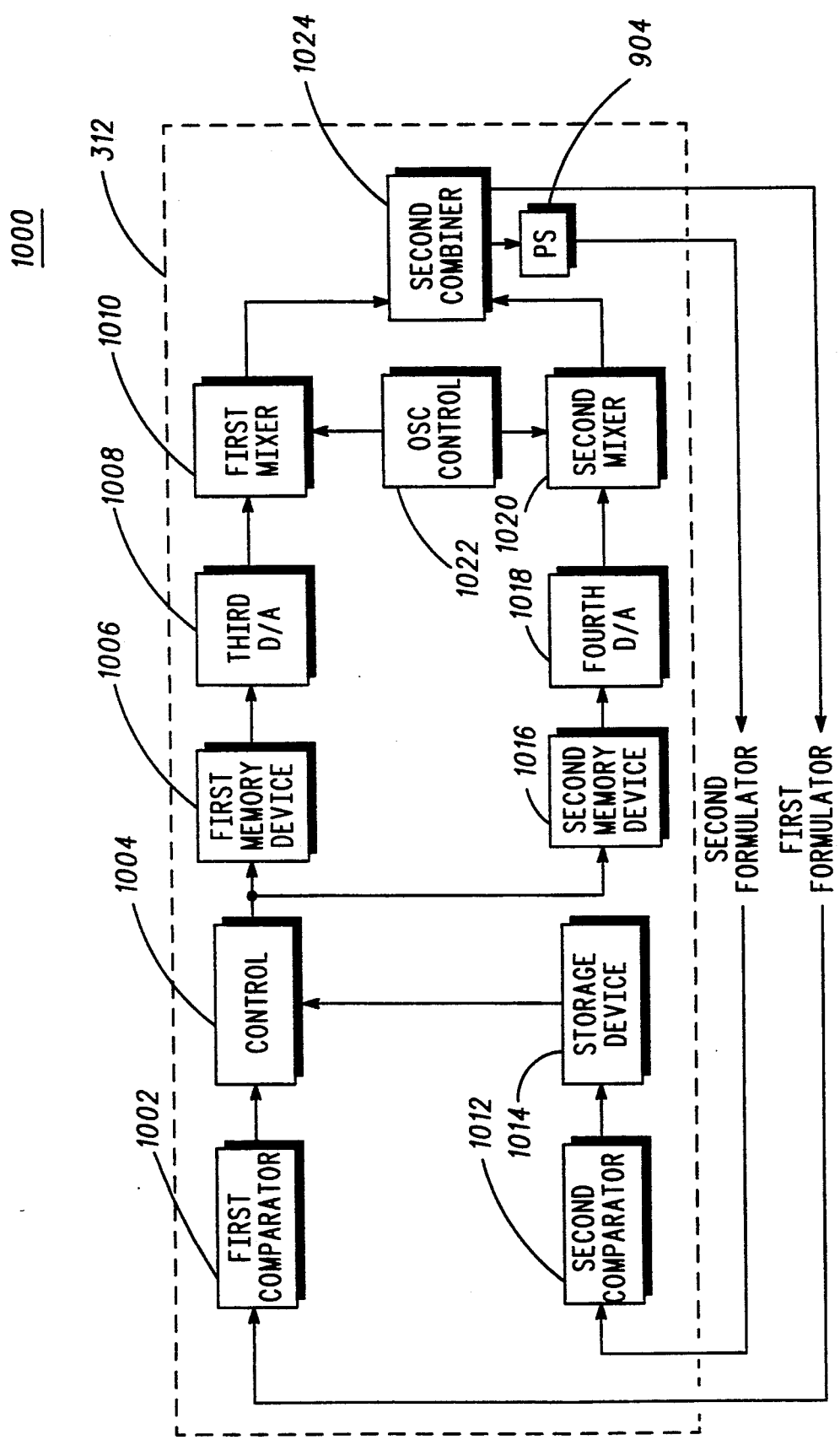
FIG. 10 illustrates one hardware implementation of a phase adjusting oscillator control utilized in the present invention.

FIG. 10, numeral 1000, illustrates one hardware implementation of a phase adjusting oscillator control utilized in the present invention. The phase adjusting oscillator control provides for the phase adjustments described above. The first formulator (310) is connected to a first comparator (1002) that is connected to a control (1004). The second formulator (314) is connected to a second comparator (1012) that is connected to a storage device (1014), typically a storage register. The control (1004) typically utilizes control logic to process a signal received by the first comparator (1002) from the first formulator (310) and a signal received by a second comparator (1012) which is stored in the storage device (1014), and utilizes a first (1006) and a second (1016) memory device to provide an adjusted sine value and an adjusted cosine value, the memory devices being connected to a third (1008) and a fourth (1018) digital to analog converter respectively that are connected to a first mixer (1010) and a second mixer (1020). Clearly one memory device may be utilized in place of the two memory devices described herein. An OSC CONTROL (1022), as previously described in FIG. 9, is operably connected to the first (1010) and second (1020) mixers. Outputs from the first (1010) and the second (1020) mixers is summed in a second combiner (1024).

The second combiner (1024), typically a seventh summer, is directly connected to the inphase (I) mixer (506) of the first formulator (310) and is connected through a phase shifter (PS) (904) to the quadrature (Q) mixer (606) of the second formulator (314).

Again, typically, the at least one open loop signal path is closed subsequent to adjusting the initial phase relationship between the at least first input signal and the at least first input feedback signal in response to the at least first comparison, thereby providing negative feedback and minimizing off channel energy splatter when desired information signals are input.

Thus, the device of the present invention provides for adjusting the initial phase relationship of at least first input signal and at least a first input feedback signal, allowing closing of an open loop such that stable feedback is obtained and splatter of off channel energy is minimized. Not only does the device of the present invention provide the above adjustments, but the device requires less than 40 milliseconds for the adjustments, thus providing more utilizable signal time.

I claim:

1. In a linear transmitter having inphase and quadrature modulation paths for at least a first input signal, a method of correcting an initial phase relationship between the at least first input signal having an input signal vector with an input phase and an input magnitude and at least a first input feedback signal having a first input feedback signal vector with a first input feedback phase and a first input feedback magnitude, wherein at least one open loop signal path is provided, comprising at least the steps of:

A) providing, on the at least one open loop signal path, at least a first test signal having at least a first test signal vector with known inphase and quadrature components to the modulation paths to obtain at least a first feedback signal vector and at least a first carrier feedback vector and obtaining a first vector sum of the at least first feedback signal vector and the at least first carrier feedback vector, the first vector sum being at least a first resultant feedback signal vector;

B) obtaining at least a first comparison of each resultant feedback signal vector obtained with the test signal inphase/quadrature components utilized to obtain that resultant feedback signal vector; and C) adjusting the initial phase relationship between the at least first input signal and the at least first input feedback signal in response to the at least first comparison, such that the time required for implementing the method is less than 40 milliseconds.

2. The method of claim 1, wherein the at least one open loop signal path is closed subsequent to adjusting the initial phase relationship between the at least first input signal and the at least first input feedback signal in response to the at least first comparison.

3. The method of claim 1, wherein only the inphase component to the modulation path has a non-zero value.

4. The method of claim 1, wherein only the quadrature component to the modulation path has a non-zero value.

5. In a linear cartesian-loop feedback transmitter having inphase and quadrature modulation paths for at least a first input signal, a method of correcting an initial phase relationship between the at least first input signal having an input signal vector with an input magnitude and an input phase and at least a first input feedback signal having a first input feedback signal vector with a first input feedback magnitude and a first input feedback phase, wherein at least one open loop signal path is provided, comprising at least the steps of:

A) providing, on the at least one open loop signal path, at least a first test signal having at least a first test signal vector with known inphase and quadrature components to the modulation paths to obtain at least a first feedback signal vector and at least a first carrier feedback vector;

B) adjusting each at least first feedback signal vector and the at least first carrier feedback vector obtained in correlation with the at least first test signal inphase/quadrature components utilized, thereby obtaining at least a first adjusted resultant feedback vector;

C) providing, on the at least one open loop signal path, at least a second test signal having at least a second test signal vector with known inphase and quadrature components to the modulation paths to obtain at least a second feedback signal vector and at least a second carrier feedback vector;

D) adjusting each second feedback signal vector and the at least second carrier feedback vector obtained in correlation with the at least second test signal inphase/quadrature components utilized, thereby obtaining at least a second adjusted resultant feedback signal vector;

E) adjusting the initial phase relationship between the at least first input signal and the at least first input feedback signal in correlation with the at least first and second adjusted resultant feedback signal vectors, such that a time required for implementing the method is less than 40 milliseconds.

6. The method of claim 5, wherein the at least one open loop signal path is closed subsequent to adjusting the initial phase relationship between the at least first input signal and the at least first input feedback signal in correlation with the at least first and second adjusted resultant feedback signal vectors.

7. The method of claim 5, wherein only the inphase component to the modulation path has a non-zero value.

8. The method of claim 7, further including the steps of:

A) wherein the at least first test signal input into the inphase modulation path is a first test signal pulse having a first test signal magnitude and a first test signal phase, obtaining the at least first carrier feedback vector and the at least first feedback signal vector and obtaining a first vector sum of those vectors, the first vector sum being at least a first resultant feedback signal vector;

B) applying a first phase adjustment to a first feedback signal path to obtain an adjusted first resultant feedback signal vector, having a quadrature vector component that is substantially equal to zero, and an inphase vector component that is substantially nonzero, and being an adjusted first vector sum of at least an adjusted first carrier feedback vector and an adjusted first feedback signal vector, the adjusted first feedback signal vector having a phase $\theta_1$ relative to the adjusted first resultant feedback signal vector;

C) inputting the at least second test signal, an inverted first test signal pulse of substantially the same magnitude as that of the first test signal pulse, to obtain a first pulse-invert feedback signal vector having invert quadrature and invert phase components;

D) obtaining a second vector sum of the first pulse-invert feedback signal vector and the at least second carrier feedback vector, the second carrier feedback vector substantially being equivalent to the at least first carrier feedback vector, the second vector sum being a second resultant feedback signal vector;

E) inverting the second resultant feedback signal vector to obtain an inverted second resultant feedback signal vector, being an inverted second vector sum having an inverted second carrier feedback vector component and an inverted first pulse-invert feedback signal vector component;

F) applying a second phase adjustment to the first feedback signal path to obtain an adjusted inverted second resultant feedback signal vector, having a quadrature vector component that is substantially equal to zero and an inphase vector component that is substantially nonzero, and being an adjusted second vector sum of an at least adjusted inverted second carrier feedback vector and an adjusted inverted first pulse-invert feedback signal vector, the adjusted inverted first pulse-invert feedback signal vector having a phase $\theta_2$ relative to the adjusted inverted second resultant feedback signal vector;

G) applying a third phase adjustment, substantially equivalent to the algebraic average of the first and second phase adjustments, to the first feedback signal path, thereby obtaining a third feedback signal vector having a third modified phase magnitude substantially equivalent to $$\left| \frac{|\theta_1| - |\theta_2|}{2} \right|.$$

9. The method of claim 5, wherein only the quadrature component to the modulation path has a non-zero value.

10. The method of claim 9, further including the steps of:

A) wherein the at least first test signal input into the quadrature modulation path is a third test signal pulse having a third test signal magnitude and a third test signal phase, obtaining an at least third carrier feedback vector and an at least third feedback signal vector and obtaining a third vector sum of those vectors, the third vector sum being at least a third resultant feedback signal vector;

B) applying a fourth phase adjustment to a second feedback signal path to obtain an adjusted third resultant feedback signal vector, having an inphase vector component that is substantially equal to zero, and a quadrature vector component that is substantially nonzero, and being an adjusted third vector sum of at least an adjusted third carrier feedback vector and an adjusted third feedback signal vector, the adjusted third feedback signal vector having a phase $\theta_3$ relative to the adjusted third resultant feedback signal vector;

C) inputting the at least second test signal, an inverted third test signal pulse of substantially the same magnitude as that of the third test signal pulse, to obtain a second pulse-invert feedback signal vector having invert quadrature and invert phase components;

D) obtaining a fourth vector sum of the second pulse-invert feedback signal vector and at least a fourth carrier feedback vector, the fourth carrier feedback vector substantially being equivalent to the at least third carrier feedback vector, the fourth vector sum being a fourth resultant feedback signal vector;

E) inverting the fourth resultant feedback signal vector to obtain an inverted fourth resultant feedback signal vector, being an inverted fourth vector sum having an inverted fourth carrier feedback vector component and an inverted second pulse-invert feedback signal vector component;

F) applying a fifth phase adjustment to the second feedback signal path to obtain an adjusted inverted fourth resultant feedback signal vector, having an inphase vector component that is substantially equal to zero and a quadrature vector component that is substantially nonzero, and being an adjusted fourth vector sum of an at least adjusted inverted fourth carrier feedback vector and an adjusted inverted second pulse-invert feedback signal vector, the adjusted inverted second pulse-invert feedback signal vector having a phase $\theta_4$ relative to the adjusted inverted fourth resultant feedback signal vector;

G) applying a sixth phase adjustment, substantially equivalent to the algebraic average of the fourth and fifth phase adjustments, to the second feedback signal path, thereby obtaining a sixth feedback signal vector having a sixth modified phase magnitude substantially equivalent to $$\left| \frac{|\theta_3| - |\theta_4|}{2} \right|.$$

11. In a radio transmitter having inphase and quadrature modulation paths for at least a first input signal, a method of correcting an initial phase relationship between the at least first input signal having an input signal vector with an input phase and an input magnitude and at least a first input feedback signal having a first input feedback signal vector with a first input feedback phase and a first input feedback magnitude, wherein at least one open loop signal path is provided, comprising at least the steps of:

A) providing, on the at least one open loop signal path, at least a first test signal having at least a first test signal vector with known inphase and quadrature components to the modulation paths to obtain at least a first feedback signal vector and at least a first carrier feedback vector and obtaining a first vector sum of the at least first feedback signal vector and the at least first carrier feedback vector, the first vector sum being at least a first resultant feedback signal vector;

B) obtaining at least a first comparison of the at least first resultant feedback signal with the test signal input inphase/quadrature components utilized to obtain that feedback signal; and C) adjusting the initial phase relationship between the at least first input signal and the at least first input feedback signal in response to the at least first comparison, such that the time required for implementing the method is less than 40 milliseconds.

12. The method of claim 11, wherein the radio transmitter is a linear transmitter.

13. The method of claim 11, wherein the at least one open loop signal path is closed subsequent to adjusting the initial phase relationship between the at least first input signal and the at least first input feedback signal in response to the at least first comparison.

14. The method of claim 11, wherein only the inphase component to the modulation path has a non-zero value.

15. The method of claim 11, wherein only the quadrature component to the modulation path has a non-zero value.

16. In a linear transmitter having inphase and quadrature modulation paths for at least a first input signal, a device for correcting an initial phase relationship between the at least first input signal having an input signal vector with an input phase and an input magnitude and at least a first input feedback signal having a first input feedback signal vector with a first input feedback phase and a first input feedback magnitude, wherein at least one open loop signal path is provided, comprising at least:

A) first means for providing, on the at least one open loop signal path, at least a first test signal having at least a first test signal vector with known inphase and quadrature components to the modulation paths to obtain at least a first feedback signal vector and at least a first carrier feedback vector and for obtaining a first vector sum of the at least first feedback signal vector and the at least first carrier feedback vector, the first vector sum being at least a first resultant feedback signal vector;

B) second means, responsive to the first means, for obtaining at least a first comparison of the at least first resultant feedback signal vector obtained with the test signal inphase/quadrature components utilized to obtain that feedback signal vector; and C) third means, responsive to the second means, for adjusting the initial phase relationship between the at least first input signal and the at least first input feedback signal in response to the at least first comparison, such that a time required for implementing the correction is less than 40 milliseconds.

17. The device of claim 16, wherein the at least one open loop signal path is closed subsequent to adjusting the initial phase relationship between the at least first input signal and the at least first input feedback signal in response to the at least first comparison.

18. The device of claim 16, wherein only the inphase component to the modulation path has a non-zero value.

19. The device of claim 16, wherein only the quadrature component to the modulation path has a non-zero value.

20. In a linear cartesian-loop feedback transmitter having inphase and quadrature modulation paths for at least a first input signal, a device for correcting an initial phase relationship between the at least first input signal having an input signal vector with an input magnitude and an input phase and a first input feedback signal having at least a first input feedback signal vector with a first input feedback magnitude and a first input feedback phase, wherein at least one open loop signal path is provided, comprising at least:

A) first means for providing, on the at least one open loop signal path, at least a first test signal having at least a first test signal vector with known inphase and quadrature components to the modulation paths to obtain at least a first feedback signal vector and at least a first carrier feedback vector and obtaining a first vector sum of the at least first feedback signal vector and the at least first carrier feedback vector, the first vector sum being at least a first resultant feedback signal vector;
B) second means, responsive to the first means, for adjusting each at least first feedback signal vector and the at least first carrier feedback vector obtained in correlation with the at least first test signal inphase/quadrature components utilized, thereby obtaining at least a first adjusted resultant feedback vector;
C) third means, responsive to the first means, for providing, on the at least one open loop signal path, at least a second test signal having at least a second test signal vector with known inphase and quadrature components to the modulation paths to obtain at least a second feedback signal vector and at least a second carrier feedback vector;
D) fourth means, responsive to the third means, for adjusting each at least second feedback signal vector and the at least second carrier feedback vector obtained in correlation with the at least second test signal inphase/quadrature components utilized, thereby obtaining at least a second adjusted resultant feedback signal vector;
E) fifth means, responsive to the second means and the fourth means, for adjusting the initial phase relationship between the at least first input signal and the at least first input feedback signal in correlation with the at least first and second adjusted resultant feedback signal vectors, such that the time required for implementing the correction is less than 40 milliseconds.

21. The device of claim 20, wherein the at least one open loop signal path is closed subsequent to adjusting the initial relationship between the at least first input signal and the at least first input feedback signal.

22. The device of claim 20, wherein only the inphase component to the modulation path has a non-zero value.

23. The device of claim 22, further comprising:
A) wherein the at least first test signal input into the inphase modulation path is a first test signal pulse having a first test signal magnitude and a first test signal phase,
sixth means, responsive to the first means, for obtaining at least the first carrier feedback vector and the at least first feedback signal vector and obtaining a first vector sum of those vectors, the first vector sum being at least a first resultant feedback signal vector;
B) seventh means, responsive to the sixth means, for applying a first phase adjustment to a first feedback signal path to obtain an adjusted first resultant feedback signal vector, having a quadrature vector component that is substantially equal to zero, and an inphase vector component that is substantially nonzero, and being an adjusted first vector sum of at least an adjusted first carrier feedback vector and an adjusted first feedback signal vector, the adjusted first feedback signal vector having a phase $\theta_1$ relative to the adjusted first resultant feedback signal vector;
C) eighth means, responsive to the first means, for inputting the at least second test signal, an inverted first test signal pulse of substantially the same magnitude as that of the first test signal pulse, to obtain a first pulse-invert feedback signal vector having invert quadrature and invert phase components;
D) ninth means, responsive to the eighth means and the first means, for obtaining a second vector sum of the first pulse-invert feedback signal vector and at least second carrier feedback vector, the second carrier feedback vector substantially being equivalent to the at least first carrier feedback vector, the second vector sum being a second resultant feedback signal vector;
E) tenth means, responsive to the ninth means, for inverting the second resultant feedback signal vector to obtain an inverted second resultant feedback signal vector, being an inverted second vector sum having an inverted second carrier feedback vector component and an inverted first pulse-invert feedback signal vector component;
F) eleventh means, responsive to the tenth means, for applying a second phase adjustment to the first feedback signal path to obtain an adjusted inverted second resultant feedback signal vector, having a quadrature vector component that is substantially equal to zero and an inphase vector component that is substantially nonzero, and being an adjusted second vector sum of an at least adjusted inverted second carrier feedback vector and an adjusted inverted pulse-invert feedback signal vector, the adjusted inverted pulse-invert feedback signal vector having a phase $\theta_2$ relative to the adjusted inverted second resultant feedback signal vector;
G) twelfth means, responsive to the seventh means and to the eleventh means, for applying a third phase adjustment, substantially equivalent to the algebraic average of the first and second phase adjustments, to the first feedback signal path, thereby obtaining a third feedback signal vector having a third modified phase magnitude substantially equivalent $$\left| \frac{|\theta_1| - |\theta_2|}{2} \right|.$$

24. The device of claim 20, wherein only the quadrature component to the modulation path has a non-zero value.

25. The device of claim 24, further including:
A) wherein the at least first test signal input into the quadrature modulation path is a third test signal pulse having a third test signal magnitude and a third test signal phase,
thirteenth means, responsive to the first means, for obtaining an at least a third carrier feedback vector and an at least third feedback signal vector and obtaining a third vector sum of those vectors, the third vector sum being a third resultant feedback signal vector;
B) fourteenth means, responsive to the thirteenth means, for applying a fourth phase adjustment to a second feedback signal path to obtain an adjusted third resultant feedback signal vector, having an inphase vector component that is substantially equal to zero, and a quadrature vector component that is substantially nonzero, and being an adjusted third vector sum of at least an adjusted third carrier feedback vector and an adjusted first feedback signal vector, the adjusted third feedback signal vector having a phase $\theta_3$ relative to the adjusted third resultant feedback signal vector;

C) fifteenth means, responsive to the first means, for inputting the at least second test signal, an inverted third test signal pulse of substantially the same magnitude as that of the third test signal pulse, to obtain a second pulse-invert feedback signal vector having invert quadrature and invert phase components;

D) sixteenth means, responsive to the fifteenth means and the first means, for obtaining a fourth vector sum of the second pulse-invert feedback signal vector and at least a fourth carrier feedback vector, the fourth carrier feedback vector substantially being equivalent to the at least third carrier feedback vector, the fourth vector sum being a fourth resultant feedback signal vector;

E) seventeenth means, responsive to the sixteenth means, for inverting the fourth resultant feedback signal vector to obtain an inverted fourth resultant feedback signal vector, being an inverted fourth vector sum having an inverted fourth carrier feedback vector component and an inverted second pulse-invert feedback signal vector component;

F) eighteenth means, responsive to the seventeenth means, for applying a fifth phase adjustment to the second feedback signal path to obtain an adjusted inverted fourth resultant feedback signal vector, having an inphase vector component that is substantially equal to zero and a quadrature vector component that is substantially nonzero, and being an adjusted fourth vector sum of an at least adjusted inverted fourth carrier feedback vector and an adjusted inverted second pulse-invert feedback signal vector, the adjusted inverted second pulse-invert feedback signal vector having a phase $\theta_4$ relative to the adjusted inverted fourth resultant feedback signal vector;

G) nineteenth means, responsive to the fourteenth means and to the eighteenth means, for applying a sixth phase adjustment, substantially equivalent to the algebraic average of the fourth and fifth phase adjustments, to the second feedback signal path, thereby obtaining a sixth feedback signal vector having a sixth modified phase magnitude substantially equivalent to $$\left| \frac{|\theta_3| - |\theta_4|}{2} \right|.$$

26. In a radio transmitter having inphase and quadrature modulation paths for at least a first input signal, a device for correcting an initial phase relationship between at least the at least first input signal having an input signal vector with an input phase and an input magnitude and at least a first input feedback signal having a first input feedback signal vector with a first input feedback phase and a first input feedback magnitude, wherein at least one open loop signal path is provided, comprising at least:

A) first means for providing, on the at least one open loop signal path, at least a first test signal with at least a first test signal vector having known inphase and quadrature components to the modulation paths to obtain at least a first feedback signal and at least a first carrier feedback vector and obtaining a first vector sum of the at least first feedback signal vector and the at least first carrier feedback vector, the first vector sum being at least a first resultant feedback signal vector;

B) second means, responsive to the first means, for obtaining at least a first comparison of the at least first resultant feedback signal with the at least first test signal input inphase/quadrature components utilized to obtain that feedback signal; and C) third means, responsive to the second means, for adjusting the initial phase relationship between at least the at least first input signal and the at least first input feedback signal in response to the at least first comparison, such that the time required for implementing the correction is less than 40 milliseconds.

27. The device of claim 26, wherein the at least one open loop signal path is closed subsequent to adjusting the initial phase relationship between at least the at least first input signal and the at least first input feedback signal in response to the at least first comparison.

28. The device of claim 26, wherein only the inphase component to the modulation path has a non-zero value.

29. The device of claim 26, wherein only the quadrature component to the modulation path has a non-zero value.

* * * * *

UNITED STATES PATENT AND TRADEMARK OFFICE
CERTIFICATE OF CORRECTION

PATENT NO.  : 5,134,718
DATED       : July 28, 1992
INVENTOR(S) : Paul H. Gailus It is certified that error appears in the above-identified patent and that said Letters Patent is hereby corrected as shown below:

```
In the Claims:

Column 15, line 24, "component; F)" should be
--component;
F)--
having F) start on line 25 instead of ending line 24.
```

Signed and Sealed this

Twenty-first Day of September, 1993

Attest:

BRUCE LEHMAN

*Attesting Officer*    Commissioner of Patents and Trademarks